United States Patent
Li et al.

(10) Patent No.: US 10,643,866 B2
(45) Date of Patent: May 5, 2020

(54) WET ETCHING MACHINE AND ETCHING METHOD USING THE SAME

(71) Applicants: BOE TECHNOLOGY GROUP CO., LTD, Beijing (CN); HEFEI XINSHENG OPTOELECTRONICS TECHNOLOGY CO., LTD, Anhui (CN)

(72) Inventors: Shengrong Li, Beijing (CN); Jaeyun Jung, Beijing (CN); Shikai Wang, Beijing (CN); Dongseob Kim, Beijing (CN); Jun Geng, Beijing (CN); Dengtao Li, Beijing (CN); Qianqian Li, Beijing (CN); Yadong Liang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/134,893

(22) Filed: Apr. 21, 2016

(65) Prior Publication Data

US 2016/0343594 A1 Nov. 24, 2016

(30) Foreign Application Priority Data

May 20, 2015 (CN) .......................... 2015 1 0260667

(51) Int. Cl.
*H01L 21/67* (2006.01)
*H01L 21/306* (2006.01)
*H01L 21/677* (2006.01)

(52) U.S. Cl.
CPC .... *H01L 21/6708* (2013.01); *H01L 21/30604* (2013.01); *H01L 21/6776* (2013.01); *H01L 21/67173* (2013.01)

(58) Field of Classification Search
None
See application file for complete search history.

(56) References Cited

U.S. PATENT DOCUMENTS 3,082,774 A * 3/1963 Benton ................... B05B 13/02
                                              134/151
5,972,110 A    10/1999 Akimoto
                       (Continued)

FOREIGN PATENT DOCUMENTS

CN      1797221 A     7/2006
CN    102629549 A     8/2012
              (Continued)

OTHER PUBLICATIONS

First Office Action for Chinese Application No. 201510260667.X, dated Mar. 30, 2017, 7 Pages.
(Continued)

*Primary Examiner* — Karla A Moore
*Assistant Examiner* — Margaret D Klunk
(74) *Attorney, Agent, or Firm* — Brooks Kushman P.C.

(57) ABSTRACT

The present disclosure provides a wet etching machine and an etching method. The wet etching machine including an etching chamber in which at least two etching layers are disposed. The etching layers are successively overlapped with each other from up to down, and each etching layer includes a first transfer carrier for receiving and transferring a substrate to be etched and a spraying apparatus disposed right above the first transfer carrier for spraying etching solution. When the total etching time is needed to be longer than the transfer time of the substrate without stopping the (Continued)

substrate, the present disclosure can solve the problems in the prior art of causing the takt time decreased due to the stopping time of the substrate is required to be increased or causing the area of the facility increased due to the number of the etching chambers connected in series is required to be increased.

9 Claims, 2 Drawing Sheets

(56) References Cited

U.S. PATENT DOCUMENTS

| | | | |
|---|---|---|---|
| 6,138,694 A | 10/2000 | Hansen et al. | |
| 6,444,029 B1 | 9/2002 | Kimura et al. | |
| 2003/0217695 A1 | 11/2003 | Fukutomi et al. | |
| 2004/0179173 A1 | 9/2004 | Nakamura et al. | |
| 2005/0167404 A1* | 8/2005 | Yamazaki | H01L 21/67028 219/121.43 |
| 2005/0241760 A1* | 11/2005 | Gau | H01L 21/67028 156/345.11 |
| 2006/0144822 A1 | 7/2006 | Gau et al. | |
| 2012/0318306 A1* | 12/2012 | Jeong | B08B 3/02 134/61 |

FOREIGN PATENT DOCUMENTS

| | | |
|---|---|---|
| CN | 102842649 A | 12/2012 |
| CN | 103409752 A | 11/2013 |
| CN | 203760438 U | 8/2014 |
| JP | H1084029 A | 3/1998 |
| JP | 2000049215 A | 2/2000 |

OTHER PUBLICATIONS

Second Office Action for Chinese Application No. 201510260667.X, dated Aug. 22, 2017, 10 Pages.

* cited by examiner

US 10,643,866 B2

WET ETCHING MACHINE AND ETCHING METHOD USING THE SAME

CROSS-REFERENCE TO RELATED APPLICATION

The present application claims a priority of Chinese patent application No. 201510260667.X filed on May 20, 2015, which is incorporated herein by reference in its entirety.

TECHNICAL FIELD

The present disclosure relates to the field of semiconductor manufacturing, in particular to a wet etching machine and an etching method using the same.

BACKGROUND

FIG. 1 is a schematic diagram showing a configuration of a wet etching machine used in flat display panel manufacturing according to the prior art. The etching machine includes an inlet buffering chamber 1, an etching chamber 2, a cleaning chamber 3, and an outlet buffering chamber 4, which are successively connected in series. The etching chamber 2 is also comprised of multiple chambers connected in series. A substrate 5 to be etched successively moves through each chamber of the etching chamber 2 for completing the etching process. The total time of the etching process is the time of the substrate passing through each of the chambers of the etching chamber 2.

However, in actual manufacturing, the required etching time of one substrate is often longer than the total transfer time of the substrate passing through each of the etching chambers without stopping the substrate. Due to the lower speed limit of transferring the substrate, the slower the substrate moves, the higher the possibility of making the substrate slip. The etching time therefore is extended due to the substrate needs to be stopped in the etching chamber, so that elongate the takt time and accordingly lower the production capacity. Further, when the total etching time required by manufacturing is longer than the transfer time of the substrate without stopping the substrate, another method in the prior art is to increase the number of the etching chambers connected in series, so as to prolong the transfer time of the substrate moving through the etching chambers, therefore increasing the total etching time and making the substrate no longer needs to stop, so that achieving the purpose of speed up the takt time. However, when increasing the number of the etching chambers connected in series, the area of the facility will be increased correspondingly. The larger the substrate, the more area of the facility will increase, and may need to build more clean rooms and increasing operation cost. Thus, this method is not an effective solution to solve the above-described problem.

SUMMARY

An object of the technical solution of the present disclosure is to provide a wet etching machine and an etching method using the same, for solving the problems of causing the takt time decreased due to the stopping time of the substrate is required to be increased or causing the area of the facility increased due to the number of the etching chambers connected in series is required to be increased, when the total etching time is needed to be longer than the transfer time of the substrate without stopping the substrate in the wet etching machine of the prior art.

According to the present disclosure, a wet etching machine includes an etching chamber, wherein at least two etching layers are disposed in the etching chamber. The etching layers are successively overlapped with each other from up to down, and each of them includes a first transfer carrier for receiving and transferring a substrate to be etched and a spraying apparatus disposed right above the first transfer carrier for spraying etching solution.

Preferably, the wet etching machine further includes:
a buffering chamber disposed on a first side of the etching chamber, wherein a second transfer carrier is disposed in the buffering chamber, so as to transfer the substrate to be etched to the etching chamber; and
a cleaning chamber disposed on a second side of the etching chamber, wherein a third transfer carrier for receiving the etched substrate from the first transfer carrier and a cleaning apparatus for cleaning the etched substrate on the third transfer carrier are disposed in the cleaning chamber.

Preferably, the wet etching machine further includes a lifting structure for positioning a holding surface of the first transfer carrier in one of the etching layers on a same plane with a holding surface of the second transfer carrier, so as to transfer the substrate to be etched horizontally from the second transfer carrier to the first transfer carrier, and for positioning the holding surface of the first transfer carrier in one of the etching layers on a same plane with a holding surface of the third transfer carrier, so as to transfer the etched substrate horizontally from the first transfer carrier to the third transfer carrier.

Preferably, each of the etching layers is disposed in an accommodating box, and the lifting structure is connected with the accommodating box so as to drive the accommodating box to move up and down, so that the holding surface of the first transfer carrier in one of the etching layers is positioned on the same plane with the holding surface of the second transfer carrier or with the holding surface of the third transfer carrier.

Preferably, the lifting structure includes:
a first lifting structure connected with the second transfer carrier and driving the second transfer carrier to move up and down, so that the holding surface of the first transfer carrier in one of the etching layers is positioned on the same plane with the holding surface of the second transfer carrier; and
a second lifting structure connected with the third transfer carrier and driving the third transfer carrier to move up and down, so that the holding surface of the first transfer carrier in one of the etching layers is positioned on the same plane with the holding surface of the third transfer carrier.

Preferably, the wet etching machine further includes a controller for controlling the spraying apparatus of each of the etching layers to simultaneously spray the etching solution in order to simultaneously etch the substrate to be etched disposed on each of the etching layers.

The present disclosure further provides an etching method using any one of the above-described wet etching machine. The method includes the steps of:
disposing the substrate to be etched on the first transfer carrier of each of the first etching layer and the second etching layer; and
etching the substrate to be etched disposed on each of the first etching layer and the second etching layer by driving the spraying apparatus of each of the first etching layer and the second etching layer to simultaneously spray the etching solution.

Preferably, the step of disposing of the substrate to be etched on the first transfer carrier of each of the first etching layer and the second etching layer includes the steps of:

positioning the holding surface of the first transfer carrier in the first etching layer on the same plane with the holding surface of the second transfer carrier, wherein the second transfer carrier is disposed in the buffering chamber which is disposed on the first side of the etching chamber, and the substrate to be etched is transferred to the etching chamber via the second transfer carrier;

transferring the substrate to be etched, which is disposed on the second transfer carrier, to the first transfer carrier in the first etching layer;

reloading a new substrate to be etched on the second transfer carrier, positioning the holding surface of the first transfer carrier in the second etching layer on the same plane with the holding surface of the second transfer carrier, and transferring the new substrate to be etched, which is disposed on the second transfer carrier, to the first transfer carrier in the second etching layer.

Preferably, after the step of etching the substrate to be etched disposed on each of the first etching layer and the second etching layer, the method further includes the steps of:

positioning the holding surface of the first transfer carrier in the first etching layer on the same plane with the holding surface of the third transfer carrier, wherein the third transfer carrier is disposed in the cleaning chamber which is disposed on the second side of the etching chamber, and the etched substrate is cleaned in the cleaning chamber;

transferring the etched substrate which is disposed on the first transfer carrier in the first etching layer to the third transfer carrier, and transferring the cleaned and etched substrate out of the cleaning chamber after cleaning the etched substrate in the cleaning chamber; and positioning the holding surface of the first transfer carrier in the second etching layer on the same plane with the holding surface of the third transfer carrier, transferring the etched substrate which is disposed on the first transfer carrier in the second etching layer to the third transfer carrier, and transferring the cleaned and etched substrate out of the cleaning chamber after cleaning the etched substrate in the cleaning chamber.

Preferably, the etching layers include two or more etching layers. Wherein in the step of disposing the substrate to be etched on the first transfer carrier of each of the first etching layer and the second etching layer, the method further includes a step of disposing the substrate to be etched also on a first transfer carrier of a third etching layer. And wherein in the step of etching the substrate to be etched disposed on each of the first etching layer and the second etching layer by driving the spraying apparatus of each of the first etching layer and the second etching layer to simultaneously spray the etching solution, the method further includes a step of driving the third etching layer together with the first etching layer and the second etching layer to simultaneously spraying the etching solution, so as to etch the substrate to be etched disposed on the third etching layer.

At least one aspect of the above-mentioned technical solutions according to the embodiments of the present disclosure provides the following advantage.

By adopting the etching chamber including at least two etching layers, the substrates to be etched, which are disposed on different etching layers, can be etched simultaneously. Thus, the etching of multiple substrates can be completed at the same time. This configuration can avoid a decrease in takt time even though increasing the stopping time of the substrate when the total etching time is required to be longer than the transfer time of the substrate without stopping the substrate in the production process. Further, the above configuration can avoid an increase in area of the facility rather than solving the above-mentioned problem by means of increasing the number of the etching chambers connected in series like in the prior art.

DETAILED DESCRIPTION

The object, technical solution, and advantage of the present disclosure will be more clearly in the following description when taken in conjunction with the specific embodiments of the present disclosure and the accompanying drawings.

According to an embodiment of the present disclosure, a wet etching machine includes an etching chamber, wherein at least two etching layers are disposed in the etching chamber, and the etching layers are successively overlapped with each other from up to down. Each of the etching layers includes a first transfer carrier for receiving and transferring the substrate to be etched, and a spraying apparatus disposed right above the first transfer carrier for spraying etching solution.

In the wet etching machine having the above-described configuration, at least two etching layers are overlapped with each other from up to down. Thus, the substrates disposed in different etching layers can be etched at the same time. When the total etching time is required to be longer than the transfer time of the substrate without stopping the substrate in the production process, this configuration can avoid a decrease in takt time due to the need of increasing the stopping time of the substrate, or avoid an increase in area of the facility when need to increase the number of the etching chambers connected in series.

Figure 1:
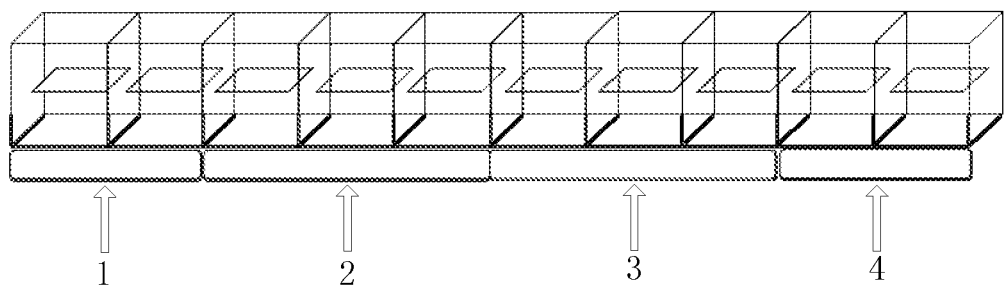
FIG. 1 is a schematic diagram showing a configuration of a wet etching machine according to the prior art.
Figure 2:
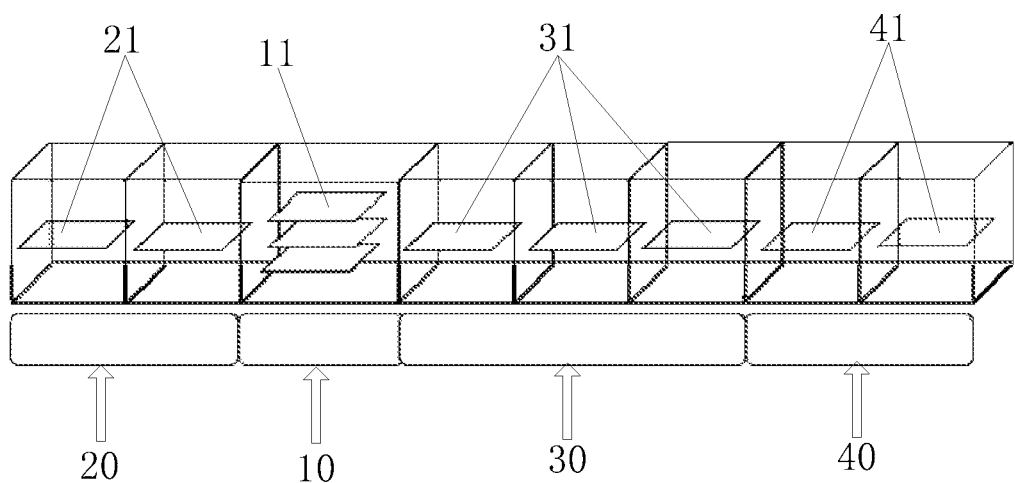
FIG. 2 is a schematic diagram showing a configuration of a wet etching machine according to an embodiment of the present disclosure.

FIG. 2 is a schematic diagram showing a configuration of a wet etching machine according to an embodiment of the present disclosure. The wet etching machine includes an etching chamber 10, a buffering chamber 20 disposed on a first side of the etching chamber 10, a cleaning chamber 30 disposed on a second side of the etching chamber 10, and a buffering chamber 40 disposed on a side of the cleaning chamber 30 away from the etching chamber 10. The buffering chamber 20 is provided as an inlet buffering chamber for substrate etching, and the buffering chamber 40 is provided as an outlet buffering chamber for substrate etching.

Further, in the etching chamber 10, at least two etching layers are disposed in an overlapped manner. Each etching layer includes a first transfer carrier 11 for holding and transferring the substrate to be etched and a spraying apparatus (not shown in FIG. 2) disposed right above the first transfer carrier 11 for spraying etching solution. In the buffering chamber 20, a second transfer carrier 21 is disposed for transferring the substrate to be etched to the etching chamber 10. A third transfer carrier 31 and a cleaning apparatus (not shown in the drawings) are disposed in the cleaning chamber 30, wherein the third transfer carrier 31 receives the etched substrate from the first transfer carrier 11, and the cleaning apparatus cleans the etched substrate which is disposed on the third transfer carrier. A fourth transfer carrier 41 is disposed in the buffering chamber 40, so as to receive the cleaned substrate from the third transfer carrier 31, and transfers the etched and cleaned substrate to the outside of the wet etching machine.

In the wet etching machine having the above-described configuration, after the substrate to be etched is transferred by the second transfer carrier 21 in the buffering chamber 20 to each etching layer of the etching chamber 10 and then been etched, the third transfer carrier 31 in the cleaning chamber 30 successively receives the etched substrate from the first transfer carrier 11 in the etching chamber 10 and cleans the substrate. Then, the fourth transfer carrier 41 in the buffering chamber 40 receives the cleaned substrate from the third transfer carrier 31 and transfers the substrate to the outside of the wet etching machine.

With use of the above-described etching chamber comprising at least two etching layers, the substrates to be etched, which are disposed on different etching layers, can be etched at the same time, that is, the etching of multiple substrates can be accomplished at the same time. This configuration can avoid a decrease in takt time even though increasing the stopping time of the substrate when the total etching time is required to be longer than the transfer time of the substrate without stopping the substrate in the production process. Further, the above configuration can avoid an increase in area of the facility rather than solving the above-mentioned problem by means of increasing the number of the etching chambers connected in series like in the prior art.

Further, when adopting the wet etching machine having the above-described configuration, the substrates to be etched in the buffering chamber 20 need to be transferred to different etching layers at different heights, and at the same time, the etched substrates disposed on the etching layers of different heights all need to be transferred to the cleaning chamber 30. Thus, the wet etching machine according to an embodiment of the present disclosure further includes a lifting structure for disposing a holding surface of the first transfer carrier 11 of one of the etching layers on the same plane with a holding surface of the second transfer carrier 21, so as to transfer the substrate to be etched horizontally from the second transfer carrier 21 to the first transfer carrier 11, and for disposing the holding surface of the first transfer carrier 11 of one of the etching layers on the same plane with a holding surface of the third transfer carrier 31, so as to transfer the etched substrate transferred horizontally from the first transfer carrier 11 to the third transfer carrier 31.

Two examples of the specific embodiment of the above lifting structure are described in details as follows, respectively.

Figure 3:
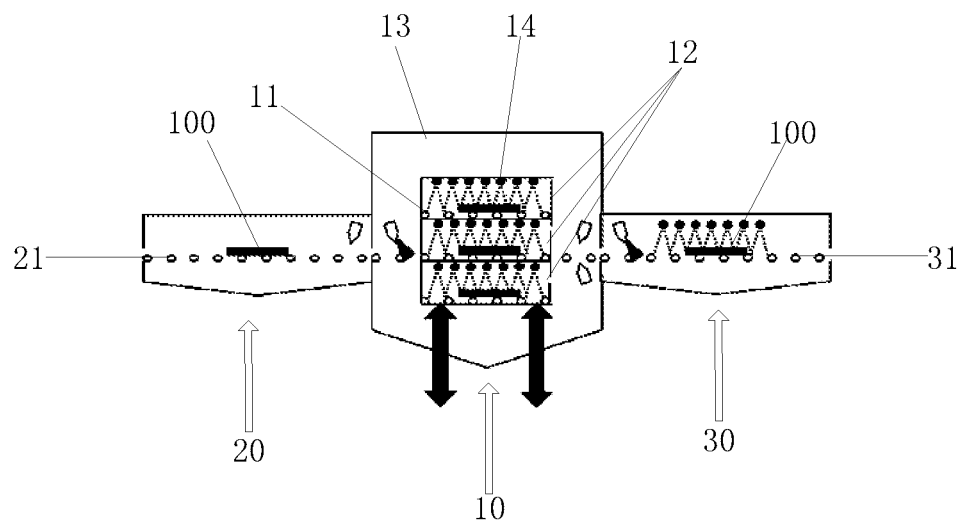
FIG. 3 is a schematic diagram showing a configuration of a wet etching machine according to a first embodiment of the present disclosure.

FIG. 3 shows a schematic view of a configuration of a wet etching machine which adopts the lifting structure according to a first embodiment. In this example, the lifting structure is connected with the etching chamber 10, so as to drive the entire etching chamber 10 to move up and down. Specifically, as shown in FIG. 3, each etching layer 12 of the etching chamber 10 is disposed in an accommodating box 13, and the lifting structure is connected with the accommodating box 13 to drive the entire accommodating box 13 to move up and down in the directions as shown by the arrows in FIG. 3. Each etching layer 12 includes a first transfer carrier 11 for disposing the substrate 100 to be etched and a spraying apparatus 14 disposed right above the first transfer carrier 11 for spraying etching solution. Specifically, the spraying apparatus 14 may includes multiple nozzles for spraying the etching solution on the substrate 100 to be etched, which is disposed on the first transfer carrier 11.

With use of the above lifting structure, the buffering chamber 20 and the cleaning chamber 30 are fixed, while the etching chamber 10 can be driven to move up and down. When the substrate to be etched, which is disposed on the second transfer carrier 21 in the buffering chamber 20, needs to be successively transferred to the different etching layers 12, the lifting structure can drive the etching chamber 10 to move up and down so that the first transfer carrier 11 of each etching layer 12 can be successively positioned on the same plane with the second transfer carrier 21, so as to successively hold the substrate 100 to be etched in every etching layer 12. When the etched substrate 100 in each etching layer 12 of the etching chamber 10 needs to be transferred to the third transfer carrier 31 of the cleaning chamber 30, then the lifting structure drives the etching chamber 10 to move up and down, the first transfer carrier 11 of each etching layer 12 can thus be successively positioned on the same plane with the third transfer carrier 31, and the etched substrate 100, which is disposed in each etching layer 12, can be successively transferred to the third transfer carrier 31 for performing cleaning process.

Figure 4:
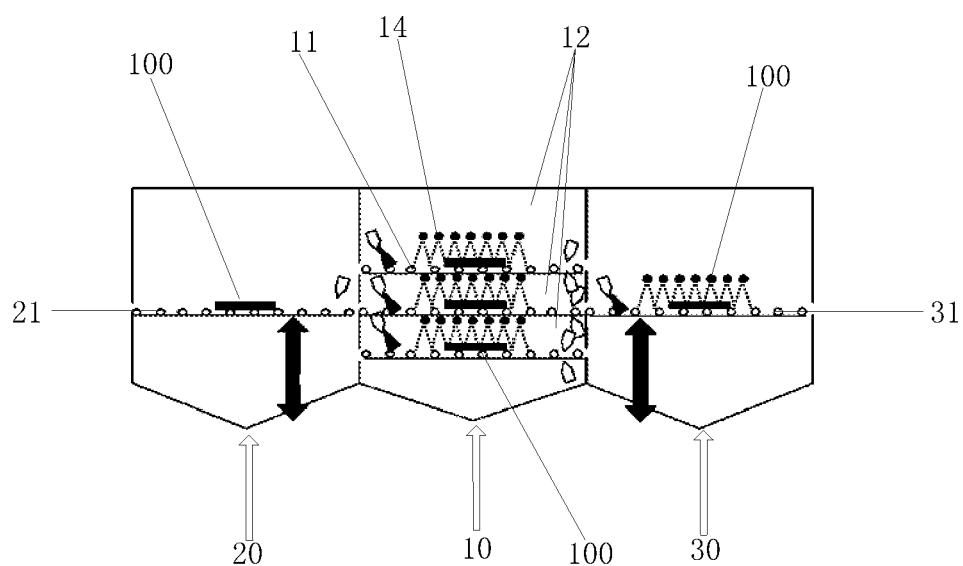
FIG. 4 is a schematic diagram showing a configuration of a wet etching machine according to a second embodiment of the present disclosure.

FIG. 4 shows a schematic view of a configuration of the wet etching machine according to a second embodiment. In this embodiment, the lifting structure includes:

a first lifting structure connected with the second transfer carrier 21 and driving the second transfer carrier 21 to move up and down, so as to position the holding surface of the first transfer carrier 11 of one of the etching layers 12 on the same plane with the holding surface of the second transfer carrier 21; and a second lifting structure connected with the third transfer carrier 31 and driving the third transfer carrier 31 to move up and down, so as to position the holding surface of the first transfer carrier 11 of one of the etching layers 12 on the same plane with the holding surface of the third transfer carrier 31.

With use of the above-described lifting structure, the buffering chamber 20 and the cleaning chamber 30 can be separately driven to move up and down, while the etching chamber 10 is fixed. When the substrate to be etched, which is disposed on the second transfer carrier 21 in the buffering chamber 20, needs to be successively transferred to different etching layers 12, the first lifting structure can drive the second transfer carrier 21 to move to a height corresponding to the height of the first transfer carrier 11 of each etching layer 12, respectively, so that the substrate 100 to be etched can be successively disposed in each etching layer 12. When the etched substrate 100 in each etching layer 12 of the etching chamber 10 needs to be transferred to the third transfer carrier 31 of the cleaning chamber 30, the second lifting structure can drive the third transfer carrier 31 to move to a height corresponding to the height of the first transfer carrier 11 of each etching layer 12, respectively, so that the etched substrate 100, which is disposed in each etching layer 12, can be successively transferred to the third transfer carrier 31 for performing cleaning process.

However, the lifting structure is not limited to the above-described two configurations. For example, all of the etching chamber 10, the buffering chamber 20, and the cleaning chamber 30 may be configured to move up and down driven by the lifting structure.

Specifically, with reference to FIG. 3 and FIG. 4, an example in which two etching layers are disposed in the etching chamber 10 will be described. In this example, a step of disposing the substrate 100 to be etched on the first transfer carrier 11 of each of the first etching layer and the second etching layer using driving structure includes the steps of:

positioning the holding surface of the first transfer carrier 11 in the first etching layer on the same plane with the holding surface of the second transfer carrier 21, and transferring the substrate 100 to be etched to the etching chamber 10 via the second transfer carrier 21;

transferring the substrate 100 to be etched, which is disposed on the second transfer carrier 21, to the first transfer carrier 11 in the first etching layer;

reloading a new substrate 100 to be etched on the second transfer carrier 21 and positioning the holding surface of the first transfer carrier 11 in the second etching layer on the same plane with the holding surface of the second transfer carrier 21, and transferring the new substrate 100 to be etched, which is disposed on the second transfer carrier 21, to the first transfer carrier 11 in the second etching layer.

Further, with reference to FIG. 3 and FIG. 4, an example in which two etching layers are disposed in the etching chamber 10 will be described. In this example, after the step of etching the substrates to be etched disposed on each of the first etching layer and the second etching layer, there are steps of:

positioning the holding surface of the first transfer carrier 11 in the first etching layer on the same plane with the holding surface of the third transfer carrier 31;

transferring the etched substrate 100, which is disposed on the first transfer carrier 11 in the first etching layer, to the third transfer carrier 31, and transferring the cleaned and etched substrate 100 out of the cleaning chamber 30 after cleaning the etched substrate 100 in the cleaning chamber 30; and positioning the holding surface of the first transfer carrier 11 in the second etching layer on the same plane with the holding surface of the third transfer carrier 31, transferring the etched substrate 100, which is disposed on the first transfer carrier 11 in the second etching layer, to the third transfer carrier 31, and transferring the cleaned and etched substrate 100 out of the cleaning chamber 30 after cleaning the etched substrate 100 in the cleaning chamber 30.

The wet etching machine according to the above-mentioned embodiments of the present disclosure may further includes a controller for controlling the spraying apparatus of each etching layer to simultaneously spray the etching solution in order to simultaneously etch the substrate to be etched disposed on each etching layer.

With the control of the controller, it can be assured that the etching processes of the substrates disposed on different etching layers are completed at the same time.

The wet etching machines of the two examples in FIG. 3 and FIG. 4 are just for clarify the structure principle of the lifting structure. In actual production, the configuration of the wet etching machine is not limited to the forms shown in FIG. 3 and FIG. 4. For example, subsequent to the cleaning chamber, there may dispose an outlet buffering chamber.

Another aspect of the present disclosure provides an etching method using the wet etching machine having the configuration shown in any one of FIG. 2 to FIG. 4. With reference to FIG. 2 to FIG. 4, the etching method includes the steps of:

disposing the substrate to be etched on the first transfer carrier of each of the first etching layer and the second etching layer; and etching the substrate to be etched disposed on each of the first etching layer and the second etching layer by driving the spraying apparatus of each of the first etching layer and the second etching layer to simultaneously spray the etching solution.

Specifically, in the above method, the step of disposing the substrate to be etched on the first transfer carrier of each of the first etching layer and the second etching layer includes the steps of:

positioning the holding surface of the first transfer carrier in the first etching layer on the same plane with the holding surface of the second transfer carrier, wherein the second transfer carrier is disposed in the buffering chamber which is disposed on the first side of the etching chamber, and the substrate to be etched is transferred to the etching chamber via the second transfer carrier;

transferring the substrate to be etched, which is disposed on the second transfer carrier, to the first transfer carrier in the first etching layer;

reloading a new substrate to be etched on the second transfer carrier, positioning the holding surface of the first transfer carrier in the second etching layer on the same plane with the holding surface of the second transfer carrier, and transferring the new substrate to be etched, which is disposed on the second transfer carrier, to the first transfer carrier in the second etching layer.

Specifically, in the above method, after the step of etching the substrates to be etched disposed on the first etching layer and the second etching layer, the method further includes the steps of:

positioning the holding surface of the first transfer carrier in the first etching layer on the same plane with the holding surface of the third transfer carrier, wherein the third transfer carrier is disposed in the cleaning chamber which is disposed on the second side of the etching chamber, and the etched substrate is cleaned in the cleaning chamber;

transferring the etched substrate, which is disposed on the first transfer carrier in the first etching layer, to the third transfer carrier, and transferring the cleaned and etched substrate out of the cleaning chamber after cleaning the etched substrate in the cleaning chamber; and positioning the holding surface of the first transfer carrier in the second etching layer on the same plane with the holding surface of the third transfer carrier, transferring the etched substrate, which is disposed on the first transfer carrier in the second etching layer, to the third transfer carrier, and transferring the cleaned and etched substrate out of the cleaning chamber after cleaning the etched substrate in the cleaning chamber.

Specifically, in the above method, the etching layers include two or more etching layers. Wherein in the step of disposing the substrate to be etched on the first transfer carrier of each of the first etching layer and the second etching layer, the method further includes a step of disposing a substrate to be etched on a first transfer carrier of a third etching layer. And wherein in the step of etching the substrate to be etched disposed on each of the first etching layer and the second etching layer by driving the spraying apparatus of each of the first etching layer and the second etching layer to simultaneously spray the etching solution, the method further includes a step of driving the third etching layer together with the first etching layer and the second etching layer to simultaneously spraying the etching solution, so as to etch the substrate to be etched disposed in the third etching layer.

With the above steps, the etching processes of the substrates to be etched, which are disposed on three etching layers, can be completed at the same time.

With the wet etching machine and the etching method using the same that are disclosed in the present disclosure, the etching processes carried out to multiple substrates can be completed at the same time. This configuration can avoid a decrease in takt time of etching even though increasing the stopping time of the substrate, when the total etching time is required to be longer than the transfer time of the substrate without stopping the substrate in the production process. Further, the above configuration can avoid an increase in area of the facility rather than solving the above-mentioned problem by means of increasing the number of the etching chambers connected in series like in the prior art.

The above are merely the preferred embodiments of the present disclosure. Obviously, a person skilled in the art may make further modification and improvement without departing from the principle of the present disclosure, and the modification and improvement shall also fall within the scope of the present disclosure.

What is claimed is:

1. A wet etching machine comprising:
   an etching chamber, wherein at least two etching layers are disposed in the etching chamber, the etching layers are successively overlapped with each other from up to down, and each of the etching layers comprises a first transfer carrier configured to receive and transfer a substrate to be etched and a spraying apparatus disposed right above the first transfer carrier for spraying an etching solution;
   a buffering chamber disposed on a first side of the etching chamber, wherein the buffering chamber contains only one second transfer carrier, and the one second transfer carrier is configured to transfer the substrates thereon to be etched to at least two first transfer carriers of the etching chamber that are located in different heights;
   a cleaning chamber disposed on a second side of the etching chamber, wherein the cleaning chamber contains only one third transfer carrier, and a cleaning apparatus configured to clean the etched substrates, and the one third transfer carrier is configured to receive the etched substrates respectively from the at least two first transfer carriers and transfer the etched substrates,
   the etching chamber, the buffering chamber, and the cleaning chamber are arranged in a line, and the first side is opposite to the second side; and
   wherein the spraying apparatus comprises a plurality of nozzles, and the wet etching machine comprises a processor configured to control the spraying apparatuses of the etching layers to simultaneously spray the etching solutions through the plurality of nozzles, to simultaneously etch the substrates to be etched on the etching layers,
   wherein the one second transfer carrier is configured to transfer horizontally the substrates to be etched to the at least two first transfer carriers, and each of the at least two first transfer carriers is configured to transfer horizontally the etched substrate to the one third transfer carrier, and
   wherein the etching layers are disposed in an accommodating box, and the accommodating box is driven to move up and down, thereby to position a holding surface of the first transfer carrier of one of the etching layers on a same plane with a holding surface of the second transfer carrier or with a holding surface of the third transfer carrier.

2. The wet etching machine according to claim 1, wherein a total etching time of one substrate that has been manufactured in the buffering chamber, the etching chamber, and the cleaning chamber is longer than a transfer time of the one substrate that has been transferred on the first, second, and third transfer carriers.

3. The wet etching machine according to claim 1, further comprising an outlet buffering chamber at a side of the cleaning chamber far away from the etching chamber, wherein the substrate cleaned by the cleaning chamber is transferred to the buffering chamber.

4. The wet etching machine according to claim 1, wherein one second transfer carrier corresponds to at least two first transfer carriers, or one third transfer carrier.

5. The wet etching machine according to claim 4, wherein the processor is configured to control substrates on one second transfer carrier to be respectively transferred onto the at least two first transfer carriers, and control substrates on the at least two first transfer carriers to be transferred onto one third transfer carrier.

6. An etching method using a wet etching machine, the wet etching machine comprising:
   an etching chamber, wherein at least two etching layers are disposed in the etching chamber, the etching layers are successively overlapped with each other from up to down, and each of the etching layers comprises a first transfer carrier configured to receive and transfer a substrate to be etched and a spraying apparatus disposed right above the first transfer carrier for spraying an etching solution;
   a buffering chamber disposed on a first side of the etching chamber, wherein the buffering chamber contains only one second transfer carrier, and the one second transfer carrier is configured to transfer the substrates thereon to be etched to at least two first transfer carriers of the etching chamber that are located in different heights;
   a cleaning chamber disposed on a second side of the etching chamber, wherein the cleaning chamber contains only one third transfer carrier, and a cleaning apparatus configured to clean the etched substrates, and the one third transfer carrier is configured to receive the etched substrates respectively from the at least two first transfer carriers and transfer the etched substrates,
   the etching chamber, the buffering chamber, and the cleaning chamber are arranged in a line, and the first side is opposite to the second side; and
   wherein the spraying apparatus comprises a plurality of nozzles, and the wet etching machine comprises a processor configured to control the spraying apparatuses of the etching layers to simultaneously spray the etching solutions through the plurality of nozzles, to simultaneously etch the substrates to be etched on the etching layers,
   wherein the one second transfer carrier is configured to transfer horizontally the substrates to be etched to the at least two first transfer carriers, and each of the at least two first transfer carriers is configured to transfer horizontally the etched substrate to the one third transfer carrier, and wherein the etching layers are disposed in an accommodating box, and the accommodating box is driven to move up and down, thereby to position a holding surface of the first transfer carrier of one of the etching layers on a same plane with a holding surface of the second transfer carrier or with a holding surface of the third transfer carrier, wherein the method comprising:

disposing the substrate to be etched on the first transfer carrier of each of the etching layers; and etching the substrate disposed on each of the etching layers by driving the spraying apparatus of each of the etching layers to simultaneously spray an etching solution;

wherein the etching layers comprise a first etching layer and a second etching layer.

7. The method according to claim 6, wherein the step of disposing the substrate to be etched on the first transfer carrier of each of the first etching layer and the second etching layer comprises:

positioning the holding surface of the first transfer carrier in the first etching layer on the same plane with the holding surface of the second transfer carrier, wherein the second transfer carrier is disposed in the buffering chamber which is disposed on the first side of the etching chamber, and the substrate to be etched is transferred to the etching chamber via the second transfer carrier;

transferring the substrate to be etched, which is disposed on the second transfer carrier, to the first transfer carrier in the first etching layer; and reloading a new substrate to be etched on the second transfer carrier, positioning the holding surface of the first transfer carrier in the second etching layer on the same plane with the holding surface of the second transfer carrier, and transferring the new substrate to be etched, which is disposed on the second transfer carrier, to the first transfer carrier in the second etching layer.

8. The method according to claim 6, wherein after the step of etching the substrates disposed on each of the first etching layer and the second etching layer, the method further comprising the steps of:

positioning the holding surface of the first transfer carrier in the first etching layer on the same plane with the holding surface of the third transfer carrier, wherein the third transfer carrier is disposed in the cleaning chamber which is disposed on the second side of the etching chamber, and the etched substrate is cleaned in the cleaning chamber;

transferring the etched substrate which is disposed on the first transfer carrier in the first etching layer to the third transfer carrier, and transferring the cleaned and etched substrate out of the cleaning chamber after cleaning the etched substrate in the cleaning chamber; and positioning the holding surface of the first transfer carrier in the second etching layer on the same plane with the holding surface of the third transfer carrier, transferring the etched substrate, which is disposed on the first transfer carrier in the second etching layer, to the third transfer carrier, and transferring the cleaned and etched substrate out of the cleaning chamber after cleaning the etched substrate in the cleaning chamber.

9. The method according to claim 6, wherein the etching layers comprise two or more etching layers, and wherein in the step of disposing the substrate to be etched on the first transfer carrier of each of the first etching layer and the second etching layer, the method further comprises a step of disposing a substrate to be etched on a first transfer carrier of a third etching layer; and in the step of etching the substrate to be etched disposed on each of the first etching layer and the second etching layer by driving the spraying apparatus of each of the first etching layer and the second etching layer to simultaneously spray the etching solution, the method further comprises a step of driving the third etching layer together with the first etching layer and the second etching layer to simultaneously spray the etching solution, so as to etch the substrate to be etched disposed on the third etching layer.

* * * * *